(12) United States Patent
Bae

(10) Patent No.: US 9,691,927 B2
(45) Date of Patent: Jun. 27, 2017

(54) SOLAR CELL APPARATUS AND METHOD OF FABRICATING THE SAME

(71) Applicant: LG INNOTEK CO., LTD., Seoul (KR)

(72) Inventor: Do Won Bae, Seoul (KR)

( * ) Notice: Subject to any disclaimer, the term of this patent is extended or adjusted under 35 U.S.C. 154(b) by 51 days.

(21) Appl. No.: 14/390,149

(22) PCT Filed: Apr. 2, 2013

(86) PCT No.: PCT/KR2013/002740
§ 371 (c)(1),
(2) Date: Oct. 2, 2014

(87) PCT Pub. No.: WO2013/151313
PCT Pub. Date: Oct. 10, 2013

(65) Prior Publication Data
US 2015/0059838 A1    Mar. 5, 2015

(30) Foreign Application Priority Data
Apr. 2, 2012   (KR) .................. 10-2012-0034001

(51) Int. Cl.
*H01L 31/044*   (2014.01)
*H01L 31/065*   (2012.01)
*H01L 31/0749*   (2012.01)
*H01L 31/072*   (2012.01)

(52) U.S. Cl.
CPC .......... *H01L 31/065* (2013.01); *H01L 31/072* (2013.01); *H01L 31/0749* (2013.01); *Y02E 10/541* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

2005/0072461 A1* 4/2005 Kuchinski ........... H01L 31/0322
136/256
2011/0214725 A1* 9/2011 Beck ................... H01L 31/0322
136/255

FOREIGN PATENT DOCUMENTS

| JP | 2012-004287 A | 1/2012 |
| KR | 10-2008-0009346 A | 1/2008 |
| KR | 10-2010-0109315 A | 10/2010 |
| KR | 10-2011-0012314 A | 2/2011 |
| KR | 10-2011-0048262 A | 5/2011 |

OTHER PUBLICATIONS

Yoon KR20100109315 English translation.*
Search Report for International Application No. PCT/KR2013/002740.

* cited by examiner

*Primary Examiner* — Bach Dinh
(74) *Attorney, Agent, or Firm* — LRK Patent Law Firm

(57) ABSTRACT

A solar cell apparatus according to the embodiment includes a support substrate; a back electrode layer on the support layer; a light absorbing layer on the back electrode layer; a plurality of buffer layers on the light absorbing layer, the plurality of buffer layers having a bandgap gradually increased from a bottom thereof to a top thereof; and a window layer on the buffer layers.

3 Claims, 1 Drawing Sheet

SOLAR CELL APPARATUS AND METHOD OF FABRICATING THE SAME

TECHNICAL FIELD

The embodiment relates to a solar cell apparatus and a method of fabricating the same.

BACKGROUND ART

Recently, as energy consumption is increased, solar cells to convert the solar light into electrical energy have been developed.

A solar cell (or photovoltaic cell) is a core element in solar power generation to directly convert solar light into electricity.

For example, if the solar light having energy greater than bandgap energy of a semi-conductor is incident into a solar cell having the PN junction structure, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

In particular, a CIGS-based solar cell, which is a PN hetero junction apparatus having a substrate structure including a glass substrate, a metallic back electrode layer, a P-type CIGS-based light absorbing layer, a high-resistance buffer layer, and an N-type window layer, has been extensively used.

However, according to the related art, when a CdS layer, which serves as a buffer layer, is grown, the cost of disposing waste materials is increased due to the high toxic CdS, so that the cost of fabricating the solar cell is increased.

DISCLOSURE OF INVENTION

Technical Problem

The embodiment provides a solar cell apparatus capable of improving environmental pollution and productivity thereof.

Solution to Problem

According to the embodiment, there is provided a solar cell apparatus including a support substrate; a back electrode layer on the support layer; a light absorbing layer on the back electrode layer; a plurality of buffer layers on the light absorbing layer, the buffer layers having a bandgap gradually increased upward; and a window layer on the buffer layers.

Advantageous Effects of Invention

According to the solar cell apparatus of the embodiment, the problem of increasing the fabrication cost of the solar cell apparatus due to Cd can be solved and the productivity of the solar cell apparatus can be improved.

In addition, the bandgap difference between the light absorbing layer and the buffer layer can be reduced so that the photoelectric conversion efficiency can be improved.

MODE FOR THE INVENTION

Figure 1:
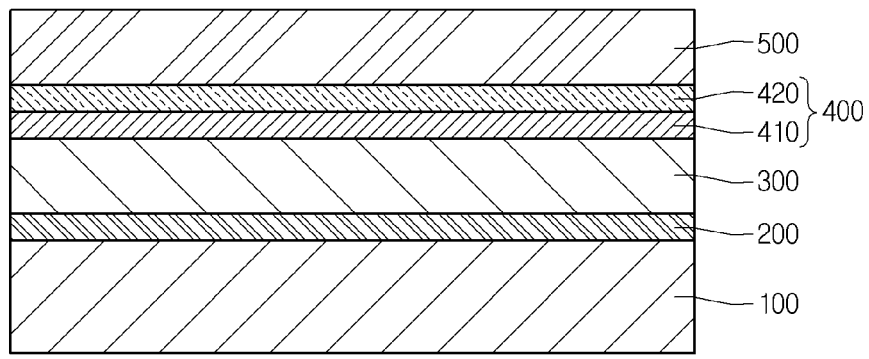
FIG. 1 is a sectional view showing a solar cell apparatus according to the embodiment.

In the description of the embodiments, it will be understood that when a substrate, a layer, a film or an electrode is referred to as being on or under another substrate, another layer, another film or another electrode, it can be directly or indirectly on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIG. 1 is a sectional view showing a solar cell apparatus according to the embodiment. Referring to FIG. 1, the solar cell panel includes a support substrate 100, a back electrode layer 200, a light absorbing layer 300, a buffer layer 400 including a first buffer layer 410 and a second buffer layer 420, and a window layer 500.

The support substrate 100 has a plate shape and supports the back electrode layer 200, the light absorbing layer 300, the buffer layer 400, and window layer 500.

The support substrate 100 may be an insulator. The support substrate 100 may be a metallic substrate. In addition, the support substrate 100 may be formed of stainless steel (SUS, STS). The support substrate 100 may be classified according to a ratio of element materials included therein and may include at least one of C, Si, Mn, P, S, Ni, Cr, Mo and Fe. The support substrate 100 may be flexible.

The back electrode layer 200 is provided on the support substrate 100. The back electrode layer 200 is a conductive layer. The back electrode layer 200 may transfer charges produced in the light absorbing layer 300 of the solar cell, thereby allowing current to flow to the outside of the solar cell. The back electrode layer 200 must represent higher electric conductivity and lower specific resistance in order to perform the above function.

In addition, the back electrode layer 200 must maintain high-temperature stability when heat treatment is performed under the atmosphere of sulfur (S) or selenium (Se) required when a CIGS compound is formed. In addition, the back electrode layer 200 must represent a superior adhesive property with respect to the substrate 100 such that the back electrode layer 200 is prevented from being delaminated from the substrate 100 due to the difference in the thermal expansion coefficient between the back electrode layer 200 and the substrate 100.

The back electrode layer 200 may include any one of molybdenum (Mo), gold (Au), aluminum (Al), chrome (Cr), tungsten (W), and copper (Cu). Among them, Mo makes the lower difference in the thermal expansion coefficient from the substrate 100 when comparing with the other elements, so that the Mo represents a superior adhesive property, thereby preventing the above de-lamination phenomenon, and totally satisfying the characteristic required for the back electrode layer 200. The back electrode layer 200 may have a thickness in the range of 400 nm to 1000 nm.

The light absorbing layer 300 may be formed on the back electrode layer 200. The light absorbing layer 300 includes a P-type semiconductor compound. In more detail, the light absorbing layer 300 includes a group I-III-VI-based compound. For example, the light absorbing layer 300 may have a Cu(In,Ga)Se$_2$ (CIGS) crystal structure, a Cu(In)Se$_2$ crystal structure, or a Cu(Ga)Se2 crystal structure. The light absorbing layer 300 may have an energy bandgap in the range of 1.1 eV to 1.3 eV, and a thickness in the range of 1.5 µm to 2.5 µm.

The buffer layer 400 is provided on the light absorbing layer 300. According to the solar cell having the light absorbing layer 300 including the CIGS compound, a P-N junction is formed between a CIGS compound thin film, which serves as a P-type semiconductor, and the window layer 50 which is an N-type semiconductor. However, since two materials represent the great difference in the lattice constant and the bandgap energy therebetween, a buffer layer having the intermediate bandgap between the bandgaps of the two materials is required to form the superior junction between the two materials.

The buffer layer 400 may include a first buffer layer 410 and a second buffer layer 420.

The energy bandgap of the first buffer layer 410 may be higher than that of the light absorbing layer 300. The energy bandgap of the second buffer layer 420 may be higher than that of the first buffer layer 410.

The thickness of the first buffer layer 410 may be different from that of the second buffer layer 420. In detail, the thickness of the first buffer layer 410 may be thinner than that of the second buffer layer 420.

The first buffer layer 410 may include Zn and Se and may have the chemical formula of ZnSe. The first buffer 410 may include Zn and Se at the ratio of 1:1. The bandgap energy may be varied with the composition ratio. The energy bandgap of the first buffer layer 410 may be in the range of about 1.5 eV to about 2.6 eV. The first buffer layer 410 may have a thickness in the range of 2 nm to 10 nm.

The second buffer layer 420 may include Zn and S and may have the chemical formula of ZnS. The second buffer 420 may include Zn and S at the ratio of 1:1. The bandgap energy may be varied with the composition ratio. The energy bandgap of the second buffer layer 420 may be in the range of about 2.7 eV to about 3.7 eV. The second buffer layer 420 may have a thickness in the range of 5 nm to 50 nm.

The high resistance buffer layer (not shown) may be provided on the buffer layer 400. The high resistance buffer layer may include zinc oxide (i-ZnO) which is not doped with impurities. The high resistance buffer layer may have an energy bandgap higher than that of the buffer layer 400, and may have a thickness in the range of 50 nm to 60 nm.

The window layer 500 is disposed on the buffer layer 400. The window layer 500 is transparent and a conductive layer. The resistance of the window layer 500 is higher than that of the back electrode layer 200.

The window layer 500 includes oxide. For example, the window layer 500 may include zinc oxide, indium tin oxide (ITO), or indium zinc oxide (IZO). In addition, the window layer 500 may include Al doped zinc oxide (AZO) or Ga doped zinc oxide (GZO). The window layer 500 may be formed at a thickness in the range of 800 nm to 1000 nm.

According to the solar cell of the embodiment, since the buffer layer is formed without including Cd, the problem of environmental pollution can be improved. In addition, since the energy bandgap is gradually varied, the photoelectric conversion effect can be improved.

FIGS. 2 to 5 are sectional views illustrating a process of fabricating a solar cell according to the embodiment. The description of the present fabricating method will be made by making reference to the above description of the solar cell. The above description of the solar cell may be incorporated with the description of the present fabricating method.

Figure 2:
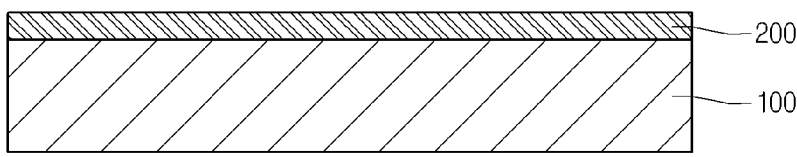
FIGS. 2 to 5 are sectional views illustrating a process of fabricating a solar cell panel according to the embodiment.

Referring to FIG. 2, the back electrode layer 200 is formed on the substrate 100. The back electrode layer 200 may be formed by depositing Mo. The back electrode layer 200 may be formed through a sputtering scheme. In addition, an additional layer such as an anti-diffusion layer may be interposed between the support substrate 100 and the back electrode layer 200.

Figure 3:
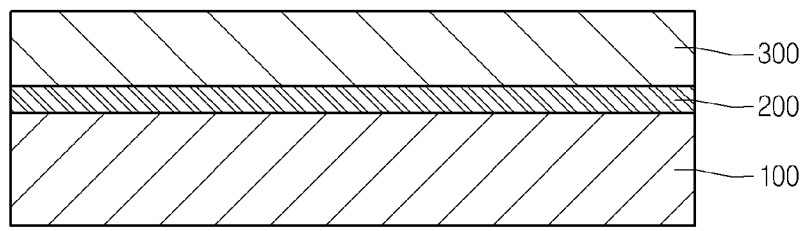

Referring to FIG. 3, the light absorbing layer 300 is formed on the back electrode layer 200. The light absorbing layer 300 is formed by extensively using schemes, such as a scheme of forming a $Cu(In,Ga)Se_2$ (CIGS) based-light absorbing layer 300 by simultaneously or separately evaporating Cu, In, Ga, and Se and a scheme of performing a selenization process after a metallic precursor film has been formed.

To the contrary, the sputtering process and the selenization process of using targets of Cu, In and Ga may be simultaneously performed. The CIS or CIG based light absorbing layer 300 may be formed through the sputtering process and the selenization process using only the Cu and In targets or the Cu and Ga targets.

Figure 4:
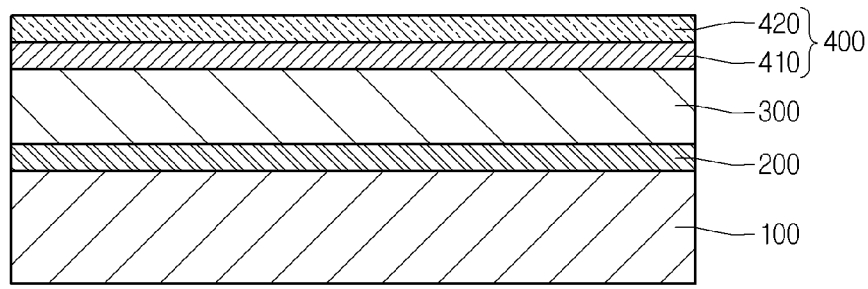
Figure 5:
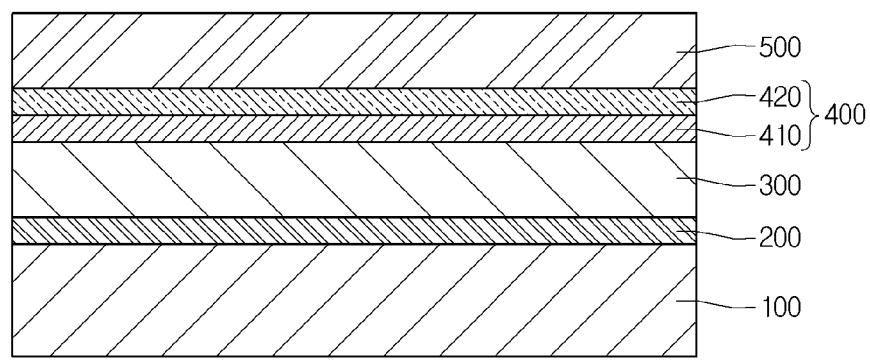

Referring to FIG. 4, the buffer layer 400 is formed on the light absorbing layer 300. The buffer layer 400 may be formed through a chemical bath deposition (CBD) scheme which includes a process P1 of dipping a substrate in a reservoir provided therein with an aqueous solution containing a thin film composition element and equipped with a heating unit for heating the aqueous solution and a stirring unit for stirring the aqueous solution; and a process P2 of forming the buffer layer by growing a thin film from a surface of the substrate.

The heating unit heats a bottom surface or a side surface of the reservoir by using a heater and includes a temperature sensor to maintain the temperature of the aqueous solution stored in the reservoir at the set temperature. The stirring unit stirs the aqueous solution stored in the reservoir such that the thin film composition element contained in the aqueous solution may extensively make contact with the substrate, thereby rapidly growing the thin film.

First, the first buffer layer 410, which has the chemical formula of ZnSe, is formed by using a Zn solution and an Se solution as a base. The first buffer layer 410 may be formed at a thickness in the range of 2 nm to 10 nm. The second buffer layer 420, which has the chemical formula of ZnS, may be formed by using a Zn solution and an S solution as a base. The second buffer layer 420 may be formed at a thickness in the range of 5 nm to 50 nm, The buffer layer 400 including the first and second buffer layers 410 and 420 may be formed through the above processes.

The buffer layer 400 may be formed through a scheme of forming a film of ZnS after forming an Se-rich layer on the top surface of the light absorbing layer 300. In this case, the first buffer layer 410 may be formed at a relatively thin thickness and the second buffer 420 may be formed at a relatively thick thickness.

Further, the buffer layer may be multi-deposited through a USP scheme to have a dual structure.

Then, the window layer 500 is formed on the buffer layer 400. The window layer 500 may be formed on the buffer layer 400 by depositing a transparent conductive material such as Al doped zinc oxide (AZO) through a sputtering scheme.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising;
a support substrate;
a back electrode layer on the support substrate;
a light absorbing layer on the back electrode layer;
a plurality of buffer layers on the light absorbing layer, the plurality of buffer layers having a bandgap gradually increased from a bottom thereof to a top thereof; and
a window layer on the buffer layers,
wherein the plurality of buffer layers comprise a first buffer layer, a second buffer layer, and a high resistance buffer layer,
wherein the first buffer layer is formed on the light absorbing layer,
wherein the second buffer layer is formed on the first buffer layer,
wherein the high resistance buffer layer is formed on the second buffer layer,
wherein the second buffer layer is thicker in thickness than the first buffer layer,
wherein the first buffer layer has a chemical formula of ZnSe,
wherein the second buffer layer has a chemical formula of ZnS,
wherein the first buffer layer has a bandgap in a range of 1.5 eV to 2.6 eV,
wherein the second buffer layer has a bandgap in a range of 2.7 eV to 3.7 eV,
wherein the high resistance buffer layer has a higher energy bandgap than that of the second buffer layer and has a chemical formula of i-ZnO,
wherein a resistance of the window layer is higher than that of the back electrode layer, and
wherein the back electrode layer has a thickness in a range of 400 nm to 1,000 nm, the light absorbing layer has a thickness in a range 1.5 µm to 2.5 µm, the first buffer layer has a thickness in a range of 2 nm to 10 nm, the second buffer layer has a thickness in a range of 5 nm to 50 nm, the high resistance buffer layer has a thickness in a range 50 nm to 60 nm and the window layer has a thickness in a range 800 nm to 1,000 nm.

2. The solar cell apparatus of claim 1, wherein the first buffer layer includes Zn and Se at the ratio of 1:1.

3. The solar cell apparatus of claim 1, wherein the second buffer layer includes Zn and S at the ratio of 1:1.

* * * * *